US008461645B2

(12) United States Patent
Otremba et al.

(10) Patent No.: US 8,461,645 B2
(45) Date of Patent: Jun. 11, 2013

(54) POWER SEMICONDUCTOR DEVICE (75) Inventors: Ralf Otremba, Kaufbeuern (DE); Josef Hoeglauer, Helmstetten (DE); Roveendra Paul, Munich (DE)

(73) Assignee: Infineon Technologies Austria AG, Villach (AT)

( * ) Notice: Subject to any disclaimer, the term of this patent is extended or adjusted under 35 U.S.C. 154(b) by 135 days.

(21) Appl. No.: 13/049,098

(22) Filed: Mar. 16, 2011

(65) Prior Publication Data

US 2012/0235227 A1 Sep. 20, 2012

(51) Int. Cl.
*H01L 29/78* (2006.01)

(52) U.S. Cl.
USPC .... 257/329; 257/676; 257/328; 257/E29.262; 257/E23.03; 438/123; 438/192; 438/285

(58) Field of Classification Search
USPC ............... 257/329, E29.262, 676, E23.03, 257/328; 438/123, 192, 285, 198
See application file for complete search history.

(56) References Cited

U.S. PATENT DOCUMENTS

| 5,528,058 | A * | 6/1996 | Pike et al. .................. 257/142 |
| 5,901,901 | A | 5/1999 | Schneegans et al. |
| 7,442,582 | B2 | 10/2008 | Reichert et al. |
| 7,508,012 | B2 | 3/2009 | Otremba |
| 7,511,382 | B2 | 3/2009 | Riedl et al. |
| 2004/0056311 | A1 * | 3/2004 | Deboy et al. .................. 257/368 |
| 2005/0250245 | A1 | 11/2005 | Riedl et al. |
| 2007/0166877 | A1 | 7/2007 | Otremba |
| 2007/0278279 | A1 | 12/2007 | Reichert et al. |
| 2008/0105907 | A1 | 5/2008 | Otremba et al. |
| 2008/0220571 | A1 | 9/2008 | Pattanayak et al. |
| 2009/0218621 | A1 * | 9/2009 | Pfirsch et al. ................. 257/342 |

FOREIGN PATENT DOCUMENTS

| DE | 19730118 A1 | 1/1999 |
| DE | 10124141 A1 | 4/2002 |
| DE | 102004021633 A1 | 12/2005 |
| DE | 102005052563 A1 | 5/2007 |
| DE | 102007001455 A1 | 7/2007 |
| EP | 0790647 A2 | 8/1997 |
| JP | 2983486 B2 | 11/1999 |

OTHER PUBLICATIONS

Aghoram U., "Effect of mechanical stress on LDMOSFETs: Dependence on orientation and gate bias", 2009 IEEE, pp. 220-223.

(Continued)

*Primary Examiner* — Cathy N Lam
(74) *Attorney, Agent, or Firm* — Murphy, Bilak & Homiller, PLLC (57) ABSTRACT

A semiconductor device includes a vertical power semiconductor chip including a semiconductor layer. A first terminal is at a first side of the semiconductor layer and a second terminal is at a second side of the semiconductor layer opposite the first side along a first direction. A drift zone is within the semiconductor layer between the first terminal and the second terminal. The drift zone has, in a central part, a compressive stress of at least 100 MPa along a second direction perpendicular to the first direction. The central part extends from 40% to 60% of an overall extension of the drift zone along the first direction and into a depth of the semiconductor layer of at least 10 μm with respect to at least one of the first side and the second side of the semiconductor layer.

23 Claims, 5 Drawing Sheets

OTHER PUBLICATIONS

Timme, H.J., "CMOS-Based Pressure Sensors", To be published in: Advanced Micro- and Nanosystems, vol. 2: CMOS-MEMS, Chapter 6, Weinheim, 2005.

Moens, µ-Raman Validated Stress-Enhanced Mobility in XtreMOS Transistors, Proceedings of the 20th International Symposium on Power Semiconductor Devices & IC's, May 18-22, 2008, IEEE, pp. 84-87.

* cited by examiner

FIG 7

POWER SEMICONDUCTOR DEVICE

BACKGROUND

Semiconductor device manufacturers constantly strive to increase the performance of their products while decreasing cost of manufacture. In power semiconductor devices a trade-off between a withstand voltage and an on-state resistance has to be met. Therefore, it is desirable to reduce the on-state resistance in a state in which the withstand voltage is secured.

SUMMARY

According to an embodiment of a semiconductor device, the semiconductor device includes a vertical power semiconductor chip having a semiconductor layer. The semiconductor device further includes a first terminal at a first side of the semiconductor layer and a second terminal at a second side of the semiconductor layer opposite the first side along a first direction. The semiconductor device further includes a drift zone within the semiconductor layer between the first terminal and the second terminal. The drift zone has, in a central part, a compressive stress of at least 100 MPa along a second direction perpendicular to the first direction, the second part extending from 40% to 60% of an overall extension of the drift zone along the first direction and into a depth of the semiconductor layer of at least 10 µm with respect to at least one of the first side and the second side of the semiconductor layer.

According to another embodiment of a vertical power semiconductor transistor, the vertical power semiconductor transistor includes a first terminal at a first side of a semiconductor layer and a second terminal at a second side of the semiconductor layer opposite the first side along a first direction. The vertical power semiconductor transistor further includes a drift zone within the semiconductor layer between the first terminal and the second terminal. The drift zone has, in a central part, a compressive stress of at least 100 MPa along a second direction perpendicular to the first direction, the central part extending from 40% to 60% of an overall extension of the drift zone along the first direction and into a depth of the semiconductor layer of at least 10 µm with respect to at least one of the first side and the second side of the semiconductor layer. The vertical power semiconductor transistor further includes at least one stressor layer arranged above at least one of the first side and the second side of the semiconductor layer. The at least one stressor layer is configured to induce a compressive stress within the drift zone. The vertical power semiconductor transistor is configured to be operated at a voltage equal to or larger than 100 V.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

In the following detailed description, reference is made to the accompanying drawings, which form a part hereof, an in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the Figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together—intervening elements may be provided between the "coupled" or "electrically coupled" elements.

Semiconductor devices including power semiconductor chips are described below. The power semiconductor chips may be of different types, may be manufactured by different technologies and may include, for example, integrated electrical, electro-optical or electro-mechanical circuits or passives. The power semiconductor chips need not be manufactured from specific semiconductor material, for example, Si, SiC, SiGe, GaAs, and, furthermore, may contain inorganic and/or organic materials that are not semiconductors, such as, for example, discrete passives, antennas, insulators, plastics or metals. Furthermore, the devices described below may include further integrated circuits to control the power integrated circuits of the power semiconductor chips.

The power semiconductor chips may comprise power MOSFETs (Metal Oxide Semiconductor Field Effect Transistors), DMOSFETs (Double-diffused MOSFET), IGBTs (Insulated Gate Bipolar Transistors), JFETs (Junction Gate Field Effect Transistors), power bipolar transistors or power diodes. More specifically, the power semiconductor chips having a vertical structure are involved, that is to say that the power semiconductor chips, more specifically vertical power semiconductor chips, are fabricated in such a way that electric currents can flow in a direction perpendicular to the main faces of the power semiconductor chips.

A power semiconductor chip having a vertical structure, i.e., vertical power semiconductor chip, may have terminals such as contact pads on its two main faces, that is to say on its top side and bottom side, or, in other words, on its front side and rear side. By way of example, the source electrode and the gate electrode of a power MOSFET may be situated on one main face, while the drain electrode of the power MOSFET may be arranged on the other main face. The contact pads may be made of aluminum, copper or any other suitable material. One or more metal layers may be applied to the contact pads of the power semiconductor chips. The metal layers may, for example, be made of titanium, nickel vanadium, gold, silver, copper, palladium, platinum, nickel, chromium or any other suitable material. The metal layers need not be homogenous or manufactured from just one material, that is to say various compositions and concentrations of the materials contained in the metal layers are possible.

The power semiconductor chip may be made of a bulk semiconductor such as a semiconductor substrate and a semiconductor layer such as an epitaxial layer generated on the bulk semiconductor. The epitaxial layer may have a thickness greater than or less than the thickness of the bulk semiconductor and may include a drift zone. As an example, the epitaxial layer may have a thickness of equal or greater than 20 µm, 30 µm, 40 µm or 50 µm. Typically, the greater the thickness of the epitaxial layer, the higher is the operating voltage of the power semiconductor chip.

An encapsulation material may at least partially cover the vertical power semiconductor chip to form an encapsulation body. The encapsulation material may be based on a polymer material, that is it may include a basis material (also referred to as a matrix material in the following) made of any appropriate duroplastic, thermoplastic or thermosetting material or laminate (prepreg). In particular, a matrix material based on epoxy resin may be used. The matrix material may embed a filler material, for instance $SiO_2$, $Al_2O_3$ or AlN particles to adjust physical properties of the encapsulation body such as, e.g., the elastic modulus or the CTE (coefficient of thermal expansion).

After its deposition, the encapsulation material may only be partially hardened and may then be cured and/or completely hardened by the application of energy (e.g., heat, UV light, etc.) to form the solid encapsulation body. Various techniques may be employed to form the encapsulation body by the encapsulation material, for example, compression molding, transfer molding, injection molding, powder molding, liquid molding, dispensing or laminating. Heat and/or pressure may be used to apply the encapsulation material.

Figure 1:
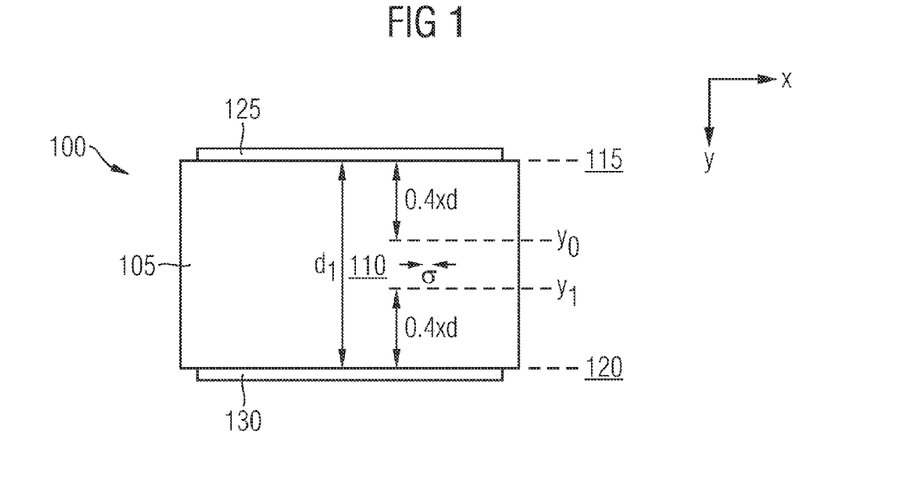
FIG. 1 illustrates a schematic cross-section of one embodiment of a vertical power semiconductor device including a compressive stress within a drift zone of a semiconductor layer.

FIG. 1 illustrates a cross-section of one embodiment of a vertical power semiconductor device 100. The vertical semiconductor power device 100 includes a semiconductor layer 105, e.g., an epitaxial semiconductor layer. A drift zone 110 constitutes a part of the semiconductor layer 105. For illustration purposes, the drift zone 110 illustrated in FIG. 1 extends from a first surface 115 at a first side such as a top side or front side of the semiconductor layer 105 to a second surface 120 at a second side such as a bottom side or rear side of the semiconductor layer 105. The overall extension of the drift zone 110 from the first surface 115 to the second surface 120 along a first direction y, in particular a vertical direction, is denoted by $d_1$. The term "overall extension of the drift zone along the first direction" is meant to mean that extension along the first direction from where charge carriers enter the drift zone, e.g., at an end of a channel, to the location where these charge carriers enter a terminal, e.g., a metal contact such as a drain contact or a semiconductor region having a higher dopant concentration than the drift zone such as a highly doped semiconductor substrate.

A first terminal 125 is arranged at the first side and a second terminal 130 is arranged at the second side. An electrical current within the vertical power semiconductor device 100 flows between the first terminal 125 and the second terminal 130 along the first direction y. In one embodiment, the first terminal 125 is a source terminal including one or a plurality of conductive elements such as metal areas and/or contact plugs and the second terminal 130 is a drain terminal and may include one or a plurality of metal layers adjoining to a semiconductor material such as a semiconductor substrate or the semiconductor layer 105. In another embodiment, the first terminal 125 is a cathode of a power diode and the second terminal 130 is an anode of the power diode.

It is to be noted that FIG. 1 is a simplified illustration of the first terminal 125, the drift zone 110 and the second terminal 130. Although the sequence of these elements along the first direction y is in the order of the first terminal 125, the drift zone 110 and the second terminal 130, a shape of the illustrated elements may differ from the simplified illustration of FIG. 1 and intervening elements may be arranged between the semiconductor layer 105 and the first terminal 125 as well as between the semiconductor layer 105 and the second terminal 130, e.g., a semiconductor substrate may be arranged between the semiconductor layer 105 and the second terminal 130. In other words, further elements may be arranged between the first surface 115 of the semiconductor layer 105 and the first terminal 125 at the first side and between the second surface 120 of the semiconductor layer 105 and the second terminal 130 at the second side.

In a central part of the drift zone 110 that extends from 40% of the overall extension $d_1$ of the drift zone 110 along the first direction y, i.e., from $y_0$, to 60% of the overall extension $d_1$ of the drift zone 110 along the first direction y, i.e., to $y_1$, a compressive stress σ amounts to at least 100 MPa along a second direction x that is perpendicular to the direction of current flow, i.e., perpendicular to the first direction y. The compressive stress σ in the central part of the drift zone 110 is illustrated by opposing arrows and leads to an improvement of the carrier mobility and thus to an improved on-state resistance.

The central part extends into a depth of the semiconductor layer 105 of at least 10 µm with respect to at least one of the first surface 115 of the semiconductor layer 105 at the first side and the second surface 120 at the second side of the semiconductor layer 105. In other words, in the embodiment illustrated in FIG. 1 a distance between a vertical level coinciding with the first surface 115 and $y_0$, amounts to 0.4×d of at least 10 µm. Similarly, a distance between the level $y_1$ and the second surface 120 at the second side amounts to 0.4×d of at least 10 µm.

The compressive stress σ in the central part of the drift zone 110 is induced by a stressor layer (not illustrated in FIG. 1). In one embodiment, the stressor layer constitutes part of the first terminal 125 and/or the second terminal 130. In another embodiment, the stressor layer constitutes part of or equals other elements not illustrated in FIG. 1, e.g., elements arranged below or above the first terminal 125 and/or elements arranged below or above the second terminal 130.

In the embodiments illustrated in FIGS. 2 to 7, examples for the stressor layer configured to induce the compressive stress within the central part of the drift zone are given.

Figure 2:
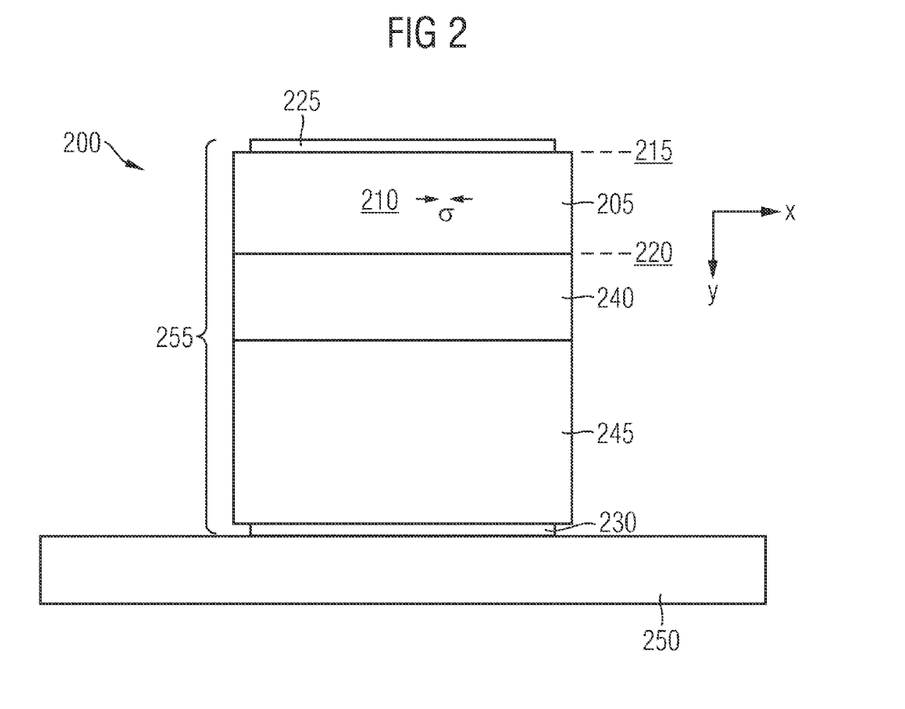
FIG. 2 illustrates a schematic cross-section of one embodiment of a vertical power semiconductor device including a stressor layer arranged between a drift zone of a semiconductor layer and a semiconductor substrate.

FIG. 2 illustrates a cross-section of one embodiment of a vertical power semiconductor device 200. Similar to the vertical power semiconductor device 100 of the embodiment illustrated in FIG. 1, the vertical power semiconductor device 200 includes a semiconductor layer 205 and a first terminal 225 at a first side of the semiconductor layer 205 as well as a second terminal 230 at a second side of the semiconductor layer 205. A central part of a drift zone 210 of the semiconductor layer 205, which extends as specified in the embodiment illustrated in FIG. 1, includes a compressive stress σ of at least 100 MPa along a second direction x perpendicular to the direction of current flow, i.e., perpendicular to a first direction y.

The compressive stress σ is induced by a stressor layer 240 adjoining to a second surface 220 of the semiconductor layer 205 at the second side. Opposite to the second surface 220 of the stressor layer 240, the stressor layer 240 adjoins to a substrate 245. In one embodiment, the substrate 245 is a semiconductor substrate. The stressor layer 240 may include one or a plurality of conducting materials and provides an electrically conducting path between the drift zone 210 and the substrate 245 along the first direction y. According to one embodiment, the stressor layer 240 is a continuous layer. According to another embodiment, the stressor layer 240 is a patterned layer including separate stressor regions such as stressor islands, for example.

In the embodiment illustrated in FIG. 2, the substrate 245 and the stressor layer 240 are arranged between the second surface 220 of the semiconductor layer 205 and the second terminal 230 at the second side. The second terminal 230, the substrate 245, the stressor layer 240, the semiconductor layer 205 including the drift zone 210, and the first terminal 225 constitute part of a vertical power semiconductor chip 255.

The vertical power semiconductor device 200 includes a carrier plate 250 such as a leadframe and the vertical power semiconductor chip 255 mounted on the carrier plate 250 via the second terminal 230.

Figure 3:
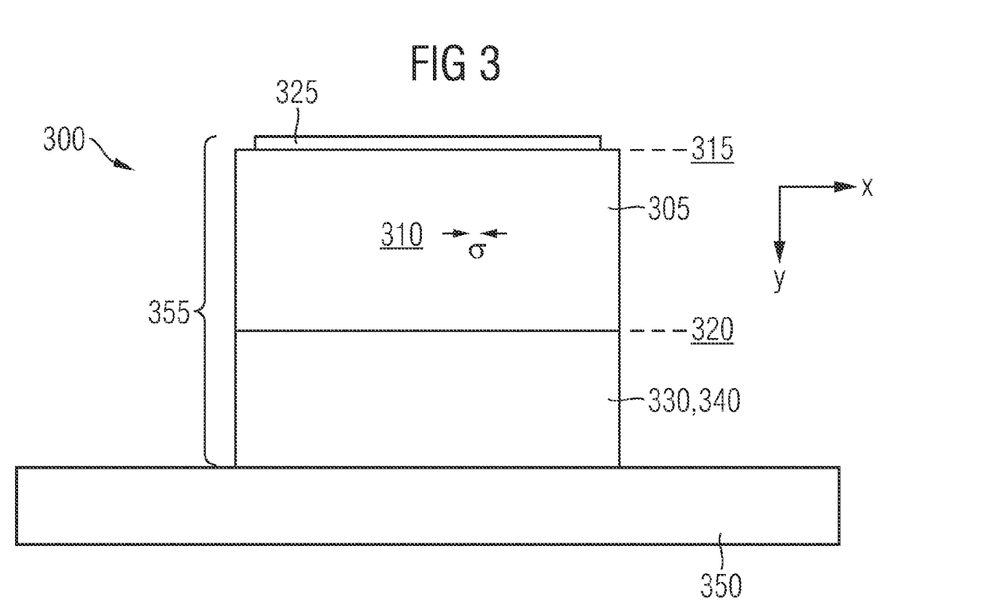
FIG. 3 illustrates a schematic cross-section of one embodiment of a vertical power semiconductor device including a metal stressor layer adjoining to a drift zone of a semiconductor layer.

FIG. 3 illustrates a cross-section of another embodiment of a vertical power semiconductor device 300. Similar to the vertical power semiconductor device 100 of the embodiment illustrated in FIG. 1, the vertical power semiconductor device 300 includes a semiconductor layer 305 and a first terminal 325 at a first side of the semiconductor layer 305 as well as a second terminal 330 at a second side of the semiconductor layer 305. A central part of a drift zone 310 of the semiconductor layer 305, which extends as specified in the embodiment illustrated in FIG. 1, includes a compressive stress σ of at least 100 MPa along a second direction x perpendicular to the direction of current flow, i.e., perpendicular to a first direction y.

The second terminal 330 equals or constitutes part of the stressor layer 340 and adjoins a second surface 320 of the semiconductor layer 305.

The stressor layer 340 can include at least one metal or metal alloy. According to one embodiment, the at least one metal or metal alloy is formed on the second surface 320 of the semiconductor layer 305 by an appropriate method such as sputtering, deposition, evaporation, etc. According to another embodiment, the stressor layer includes at least one metal foil on the second surface 320 of the semiconductor layer 305. The metal foil may be a Cu foil or may include Cu.

A thickness of the stressor layer 340 is appropriately chosen so as to induce the compressive stress σ of at least 100 MPa in the central part of the drift zone 310. The thickness may of the stressor layer 340 be in a range of 50 μm to 1 mm, or 100 μm to 1 mm, or 200 μm to 1 mm.

The second terminal 330, the semiconductor layer 305 including the drift zone 310, and the first terminal 325 constitute part of a vertical power semiconductor chip 355.

The vertical power semiconductor device 300 includes a carrier plate 350 such as a leadframe and the vertical power semiconductor chip 355 mounted on the carrier plate 350 via the second terminal 330.

Figure 4:
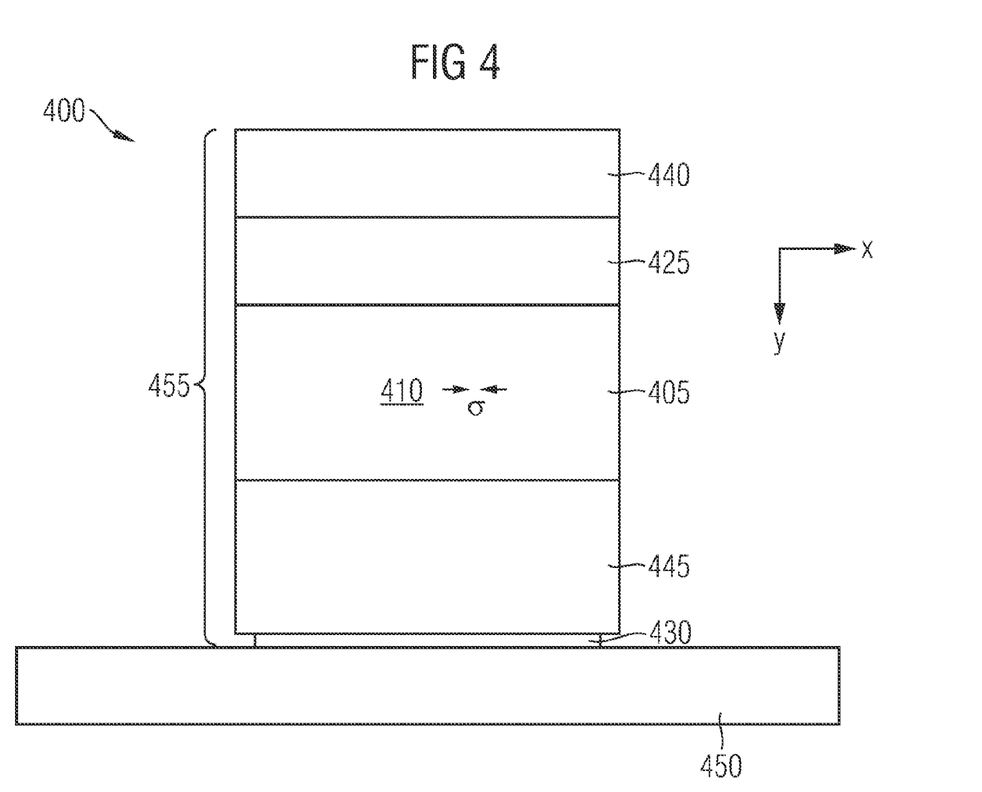
FIG. 4 illustrates a schematic cross-section of one embodiment of a vertical power semiconductor device including a stressor layer arranged at a front side of the device.

FIG. 4 illustrates a cross-section of yet another embodiment of a vertical power semiconductor device 400. Similar to the vertical power semiconductor device 100 of the embodiment illustrated in FIG. 1, the vertical power semiconductor device 400 includes a semiconductor layer 405 and a first terminal 425 at a first side of the semiconductor layer 405 as well as a second terminal 430 at a second side of the first semiconductor layer 405. A central part of a drift zone 410 of the semiconductor layer 405, which extends as specified in the embodiment illustrated in FIG. 1, includes a compressive stress σ of at least 100 MPa along a second direction x perpendicular to the direction of current flow, i.e., perpendicular to a first direction y.

The semiconductor layer 405 is formed on one surface of a semiconductor substrate 445 such as a semiconductor wafer, e.g., by epitaxial growth. In one embodiment, the semiconductor substrate 445 is a highly doped semiconductor substrate. The second terminal 430 adjoins the other surface of the semiconductor substrate 445.

A stressor layer 440 is arranged above the first terminal 425. According to other embodiments, the stressor layer 440 may equal or constitute part of the first terminal 425.

A material and thickness of the stressor layer 440 is appropriately chosen so as to induce the compressive stress σ of at least 100 MPa in the central part of the drift zone 410. The central part of the drift zone 410 refers to the part as described with regard to the embodiment illustrated in FIG. 1. According to one embodiment, the stressor layer 440 includes one or a plurality of metals or metal alloys such as metal layers, e.g., a Cu layer, metal alloy layers, metal foils, e.g., a Cu foil, or any combination thereof. A thickness of the stressor layer 440 may be in a range of 50 μm to 1 mm, or 100 μm to 1 mm, or 200 μm to 1 mm. The stressor layer 440 may also, in addition to metal or metal alloy or alternatively to metal or metal alloy, include at least one of oxide, silicide, polysilicon, organic coating.

The second terminal 430, the semiconductor substrate 445, the semiconductor layer 405 including the drift zone 410, the first terminal 425 and the stressor layer 440 constitute part of a vertical power semiconductor chip 455.

The vertical power semiconductor device 400 includes a carrier plate 450 such as a leadframe and the vertical power semiconductor chip 455 mounted on the carrier plate 450 via the second terminal 430.

Figure 5:
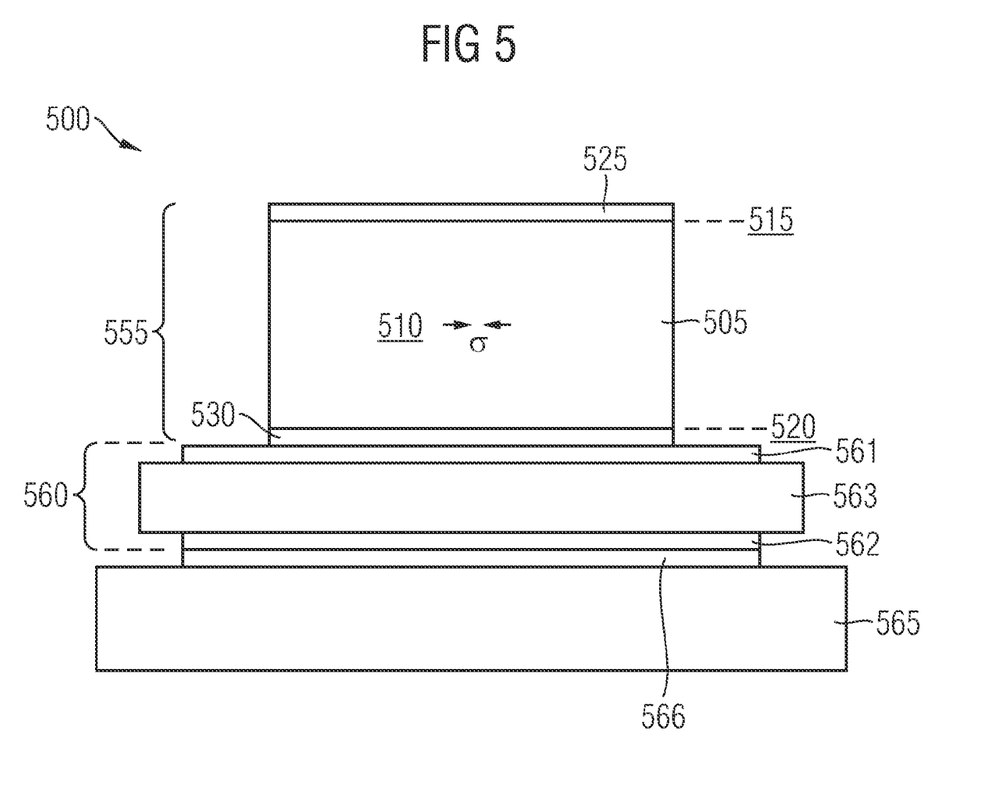
FIG. 5 illustrates a schematic cross-section of one embodiment of a power semiconductor device mounted on a DCB (Direct Copper Bond) substrate and including a compressive stress within a drift zone of a semiconductor layer.

FIG. 5 illustrates a cross-section of yet another embodiment of a vertical power semiconductor device 500. Similar to the vertical power semiconductor device 100 of the embodiment illustrated in FIG. 1, the vertical power semiconductor device 500 includes a semiconductor layer 505 and a first terminal 525 at a first side of the semiconductor layer 505 as well as a second terminal 530 at a second side of the semiconductor layer 505. A central part of a drift zone 510 of the semiconductor layer 505, which extends a specified in the embodiment illustrated in FIG. 1, includes a compressive stress σ of at least 100 MPa along a second direction x perpendicular to the direction of current flow, i.e., perpendicular to a first direction y.

The second terminal 530, the semiconductor layer 505 including the drift zone 510, and the first terminal 525 constitute part of a vertical power semiconductor chip 555.

The vertical power semiconductor chip 555 is mounted on a DCB substrate 560. The DCB substrate 560 includes a first Cu layer 561 and a second Cu layer 562 arranged on opposite surfaces of an insulating plate 563 such as a ceramic plate. The DCB substrate 560 is arranged on a bottom plate 565 such as a Cu plate via the second Cu layer 562 and an adhesive layer 566 such as a solder layer.

The compressive stress in the central part of the drift zone 510 is induced by a stressor layer (not illustrated in FIG. 5). Examples for the stressor are given in the embodiments illustrated in FIGS. 2 to 4. The compressive stress σ in the central part of the drift zone 510 may also be induced by mounting and connecting the vertical power semiconductor chip 555 in a power package, e.g., SuperSO8, via a stiff adhesive layer, e.g., diffusion solder layer such as AuSn, AgSn, CuSn, Sn, AuSi, AuGe, AgIn and connecting the power package to the DCB substrate 560 via a connecting layer such as a diffusion solder layer. The stiff adhesive layer between the vertical power semiconductor chip 555 and the power package constitutes part of the stressor layer.

Figure 6:
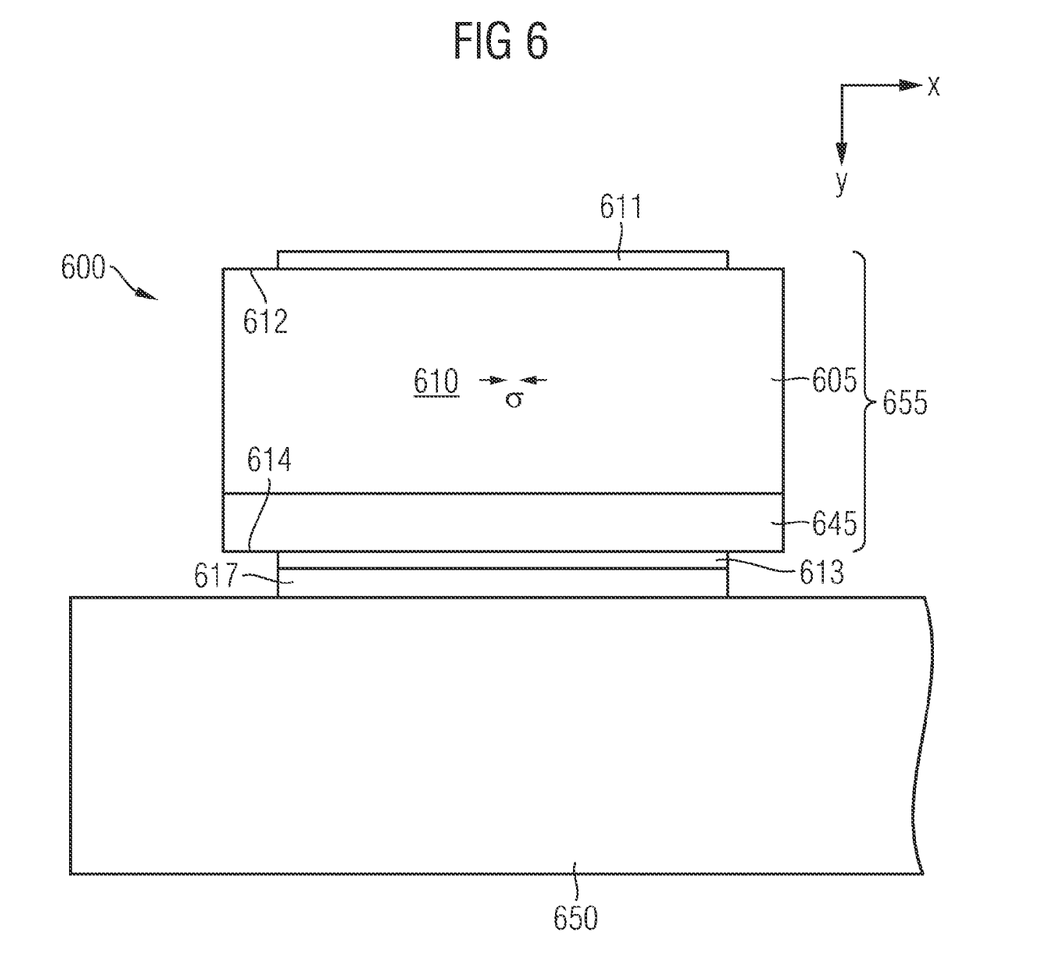
FIG. 6 is a schematic cross-section of one embodiment of a semiconductor device including a vertical power semiconductor chip mounted on an electrically conducting carrier.

FIG. 6 schematically illustrates one embodiment of a power semiconductor device 600 in cross-section. A power semiconductor chip 655 of the power semiconductor device 600 has one or more first contact pads 611 arranged on a first main face 612 and one or more second contact pads 613 arranged on a second main face 614 opposite the first main face 612. Further, the power semiconductor device 600 includes a carrier plate 650 on which the power semiconductor chip 655 is mounted.

The power semiconductor chip 655 is a vertical device, i.e., electric currents can flow in a direction perpendicular to the main faces 612, 614 of the power semiconductor chip 655. In one embodiment, the power semiconductor chip 655 is a power transistor and the first contact pad(s) 611 may form a source terminal and the second contact pad(s) 613 may form a drain terminal. In this embodiment, typically, a gate terminal (not shown) is arranged on the first main face. In other embodiments, the power semiconductor chip 655 may be a power diode, and the first contact pad(s) 611 may, e.g., form an anode terminal and the second contact pad(s) 613 may form a cathode terminal of the power diode or vice versa.

More specifically, the power semiconductor chip 655 may include an epitaxial layer 605 arranged, e.g., on a bulk semiconductor 645. A person skilled in the art is well aware of multiple semiconductor processing techniques to produce such a structure. Briefly, the epitaxial layer 605 may be fabricated on a wafer made of semiconductor material. The upper surface of the wafer may correspond to the upper surface of the bulk semiconductor 645 in FIG. 6. The wafer, for instance a silicon wafer, may be doped by suitable impurity atoms (dopants) to enhance the electrical conductivity of the semiconductor material of the bulk semiconductor 645. By way of example, the wafer may be doped to obtain a $n^+$ doped bulk silicon of high electrical conductivity.

Still during frontend wafer processing, the epitaxial layer 605 may be generated on the upper surface of the wafer. All epitaxial techniques known to a person skilled in the art may be used, e.g., MBE (molecular beam epitaxy), LPE (liquid phase epitaxy), etc. The epitaxial layer 605 may contain a sequence of p-n junctions to form the active semiconductor region of the power device 600.

The first contact pad(s) 611 are formed on an upper surface of the epitaxial layer 605. This step may still be carried out during wafer processing, that is during frontend processing. In other embodiments, the first contact pad(s) 611 may be formed after separation of the wafer into multiple power semiconductor chips 655.

Similar to the first contact pad(s) 611, the second contact pad(s) 613 are formed either during wafer processing on the intact wafer or on the power semiconductor chips 655 singularized from the wafer.

Integrated power circuits and possibly further integrated circuits can be electrically accessed via the contact pads 611, 613. The contact pads 611, 613 may be made of a metal, for example, aluminum or copper, and may have any desired shape and size.

The power semiconductor chip 655 may be mounted on the upper surface of the carrier plate 650. A connecting layer 617 of solder material, e.g., a diffusion solder material comprising e.g., AuSn and/or other metal materials may be used to electrically connect and mechanically secure the second contact pad(s) 613 to the carrier plate 650.

The carrier plate 650 may be of various types. In one embodiment the carrier plate 650 may be a patterned metal sheet or plate, e.g., a leadframe. The carrier plate 650 may have metal plate regions separated from each other by spacings. In another embodiment the carrier plate 650 may be a continuous, unpatterned metal plate or sheet. The carrier plate 650 may be produced by a stamping and/or milling process. The metal of which the carrier plate is made may, e.g., comprise one or more metals of the group of copper, aluminum, nickel, gold or any alloy based on one or more of these metals. The carrier plate 650 (e.g., a leadframe) may be made of one single bulk metal layer or a multi metal layer structure. The carrier plate 650 may serve as a heat sink for dissipating the heat generated in the power semiconductor chip 655.

A compressive stress σ of at least 100 MPa in a central part of a drift zone 610 within the epitaxial layer 605 can be set by dimensions and material properties of one or numerous stressor layers such as the first and/or second contact pads 611, 613. A definition of the central part is given in the embodiment associated with FIG. 1.

Figure 7:
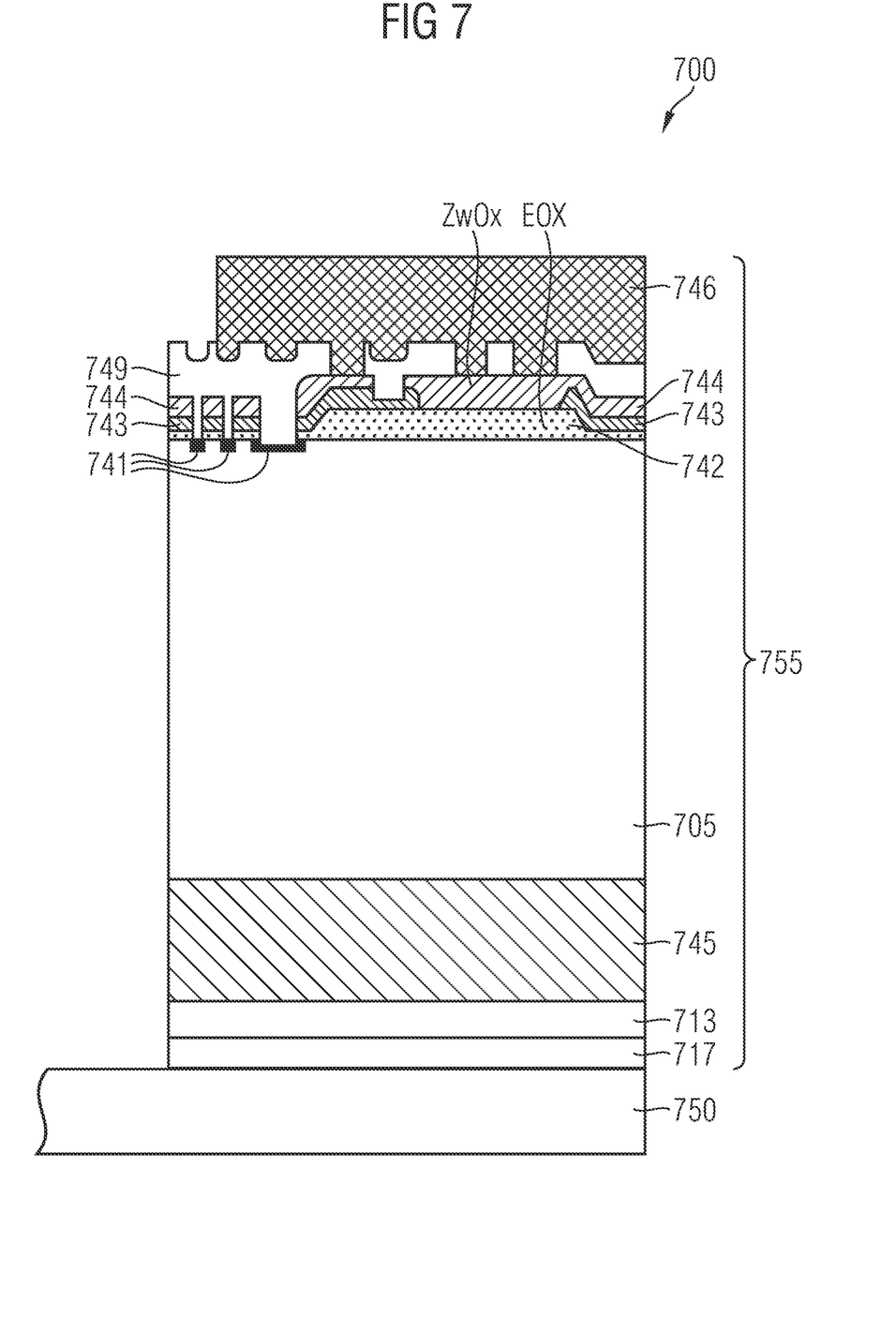
FIG. 7 is a cross-sectional view of one detailed embodiment in accordance with the embodiment illustrated in FIG. 6.

FIG. 7 is a cross-sectional view of a more detailed, exemplary embodiment in accordance with the embodiment shown in FIG. 6. The semiconductor device 700 shown in FIG. 7 is a power MOSFET having an operating voltage of 600 V. A carrier plate 750 is a leadframe made of copper having, for instance, a thickness of 1.3 mm. In general, the thickness may be equal or greater than 1.0 mm or even 2.0 mm. A connecting layer 717 is made of an AuSn diffusion solder and has a thickness of 1.2 μm. A second contact pad 713 may be a Cu layer or Cu foil having a thickness of more than 100 μm, more than 200 μm, more than 300 μm or more than 400 μm.

A bulk semiconductor 745 may be made of $n^+$ doped silicon and may have a thickness in a range of 1 μm to 100 μm, in particular 10 μm to 50 μm. The bulk semiconductor 745 may behave essentially as a metal. The degenerate semiconductor-metal junction between the bulk semiconductor 745 and the second contact pad 713 also has a high electrical conductivity. The bulk semiconductor 745 and the second contact pad 713 represent a drain terminal of the power MOSFET.

An epitaxial layer 705 represents the active region of a power semiconductor chip 755. In this embodiment, the epitaxial layer 705 has a thickness of 52.5 μm, allowing for an operating voltage of about 600 V. The epitaxial layer 705 includes a series of p-n. In general, the epitaxial layer 705 may have a thickness of equal or greater than 20 µm, in particular, equal or greater than 30 µm, still, in particular, equal or greater 40 µm or, in particular, equal or greater than 50 µm. As a rule of thumb, each 100 V of operating voltage require about 9 µm of silicon epitaxial layer thickness. Thus, the power semiconductor chip 755 may have an operating voltage of equal or greater than 200 V, in particular equal or greater than 300 V, still in particular equal or greater than 400 V or in particular equal or greater than 500 V.

A contact zone 741 is provided within the epitaxial layer 705. The contact zone 741 is electrically connected to the p-n junctions of the epitaxial layer 705 to form a source contact thereof.

The contact zone 741 is covered by a first insulating layer 742 such as, e.g., an oxide layer, which is provided on top of the epitaxial layer 705. The insulating layer 742 is referred to as EOX in FIG. 7 and is configured to have openings through which the contact zone 741 may be accessed.

A first patterned metal layer 743 is arranged on the insulating layer 742. The first patterned metal layer 743 may serve to provide an electrical functionality such as, e.g., electrostatic shielding of the power MOSFET. Further, additional patterned metal layers not illustrated in the sectional view of FIG. 7 may be arranged in the vicinity of an upper face of the epitaxial layer 705, e.g., patterned metal layers to provide for additional connectivity and/or signal routing such as, e.g. a patterned metal layer to form a gate contact.

A second patterned insulating layer 744 such as, e.g., an oxide layer may be arranged on the first patterned metal layer 743. The second insulating layer 744 is referred to as ZwOX in FIG. 7 and includes openings through which the contact zone 741 is electrically contacted by a second metal layer 749. The second metal layer 749 may constitute the source terminal of the power MOSFET. Further, a polymer layer 746 may be provided to cover the second metal layer 749. A polymer material such as parylene, photoresist material, imide, epoxy, duroplast or silicone may be used.

By way of example, the layers 742, 743, 744 and 746 may have the following dimensions in thickness. The first insulating layer 742 may have a thickness of 2.4 µm, the second insulating layer 744 may have a thickness of 1.5 µm, the first patterned metal layer 743 may have a thickness of 5.0 µm and the polymer layer 746 may have a thickness of 6.0 µm. It is to be noted that the dimensions, materials and the provision of these layers are exemplary and are subject to variations in accordance with the needs of the semiconductor design.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a vertical power semiconductor chip including a semiconductor layer;
a first terminal at a first side of the semiconductor layer;
a second terminal at a second side of the semiconductor layer opposite the first side along a first direction; and
a drift zone within the semiconductor layer between the first terminal and the second terminal, the drift zone having, in a central part, a compressive stress of at least 100 MPa along a second direction perpendicular to the first direction, the central part extending from 40% to 60% of an overall extension of the drift zone along the first direction and into a depth of the semiconductor layer of at least 10 µm with respect to at least one of the first side and the second side of the semiconductor layer;
at least one stressor layer adjoining the semiconductor layer, the at least one stressor layer configured to induce the compressive stress within the drift zone.

2. The semiconductor device of claim 1, wherein the at least one stressor layer includes at least one of a metal, a metal silicide, a doped silicon, an oxide, and an oxide filled in a trench.

3. The semiconductor device of claim 1, further comprising a semiconductor substrate adjoining the at least one stressor layer, the at least one stressor layer arranged between the semiconductor layer and the semiconductor substrate.

4. The semiconductor device of claim 3, wherein the at least one stressor layer is patterned with a plurality of separate stressor regions.

5. The semiconductor device of claim 3, further comprising an electrically conducting carrier attached to the semiconductor substrate, wherein a distance between the electrically conducting carrier and the semiconductor layer is larger than 50 µm.

6. The semiconductor device of claim 3, wherein the at least one stressor layer is a metal layer having a thickness of at least 50 µm, the metal layer arranged between the semiconductor semiconductor layer and an electrically conducting carrier.

7. The semiconductor device of claim 6, wherein the metal layer is a metal foil.

8. The semiconductor device of claim 6, wherein the metal layer includes Cu.

9. The semiconductor device of claim 1, further comprising at least one stressor layer arranged at a front side of the vertical power semiconductor chip opposite a rear side, the vertical power semiconductor chip arranged on an electrically conducting carrier via the rear side.

10. The semiconductor device of claim 9, wherein the at least one stressor layer includes at least one of oxide, silicide, polysilicon, organic coating, metal, and metal foil.

11. The semiconductor device of claim 9, wherein the at least one stressor layer includes a metal layer having a thickness of more than 10% of the thickness of the electrically conducting carrier.

12. The semiconductor device of claim 9, wherein the at least one stressor layer includes a metal layer having a thickness larger than an overall thickness of both the semiconductor layer and a semiconductor substrate adjoining the at least one stressor layer.

13. The semiconductor device of claim 9, wherein the at least one stressor layer includes a metal layer having a thickness that is at least 20 times larger than a thickness of a metal layer at the rear side of the power semiconductor chip.

14. The semiconductor device of claim 1, wherein the power semiconductor chip is arranged on a Direct Copper Bonded (DCB) substrate.

15. The semiconductor device of claim 1, wherein a ratio of a thickness of the at least one stressor layer to the thickness of the semiconductor layer is between 2 and 20.

16. The semiconductor device of claim 1, wherein the vertical power semiconductor chip includes a vertical power semiconductor transistor having an operation voltage equal to or larger than 200 V.

17. A vertical power semiconductor transistor, comprising:
a semiconductor layer;
a first terminal at a first side of the semiconductor layer;
a second terminal at a second side of the semiconductor layer opposite the first side along a first direction;
a drift zone within the semiconductor layer between the first terminal and the second terminal, the drift zone having, in a central part, a compressive stress of at least 100 MPa along a second direction perpendicular to the first direction, the central part extending from 40% to 60% of an overall extension of the drift zone along the first direction and into a depth of the semiconductor layer of at least 10 µm with respect to at least one of the first side and the second side of the semiconductor layer;
at least one stressor layer arranged above at least one of the first side and the second side of the semiconductor layer, the at least one stressor layer configured to induce the compressive stress within the drift zone; and
wherein the vertical power semiconductor transistor is configured to be operated at a voltage equal to or larger than 200 V.

18. The vertical power semiconductor transistor of claim 17, wherein the at least one stressor layer adjoins the semiconductor layer.

19. The vertical power semiconductor transistor of claim 18, wherein the at least one stressor layer is a metal layer having a thickness of at least 50 µm, the metal layer arranged between the semiconductor layer and an electrically conducting carrier.

20. The vertical power semiconductor transistor of claim 19, wherein the metal layer is a metal foil.

21. The vertical power semiconductor transistor of claim 17, wherein the at least one stressor layer is arranged at a front side of the vertical power semiconductor transistor opposite a rear side, the vertical power semiconductor transistor arranged on an electrically conducting carrier via the rear side.

22. The vertical power semiconductor transistor of claim 17, wherein a ratio of a thickness of the at least one stressor layer to the thickness of the semiconductor layer is between 2 and 20.

23. The vertical power semiconductor transistor of claim 17, wherein the vertical power semiconductor transistor is arranged on a Direct Copper Bonded (DCB) substrate.

* * * * *

UNITED STATES PATENT AND TRADEMARK OFFICE
CERTIFICATE OF CORRECTION

| | |
|---|---|
| PATENT NO. | : 8,461,645 B2 |
| APPLICATION NO. | : 13/049098 |
| DATED | : June 11, 2013 |
| INVENTOR(S) | : Ralf Otremba et al. |

It is certified that error appears in the above-identified patent and that said Letters Patent is hereby corrected as shown below:

In the Claims

Column 10, line 48 (claim 6, line 4) please change "the semiconductor semiconductor layer" to -- the semiconductor layer --

Signed and Sealed this
Eighteenth Day of February, 2014

Michelle K. Lee
*Deputy Director of the United States Patent and Trademark Office*